United States Patent
Hung

(10) Patent No.: US 8,253,840 B2
(45) Date of Patent: Aug. 28, 2012

(54) ELECTROMAGNETIC SHIELDING COATING AND LENS MODULE UTILIZING THE SAME

(75) Inventor: Hsin-Chin Hung, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 238 days.

(21) Appl. No.: 12/765,877

(22) Filed: Apr. 23, 2010

(65) Prior Publication Data

US 2011/0075014 A1    Mar. 31, 2011

(30) Foreign Application Priority Data

Sep. 25, 2009   (CN) .......................... 2009 1 0307685

(51) Int. Cl.
*G02B 13/16*    (2006.01)
*H04N 5/225*    (2006.01)
*G06K 7/10*     (2006.01)
*F21V 9/06*     (2006.01)

(52) U.S. Cl. ........ 348/335; 348/340; 359/350; 359/359; 359/360

(58) Field of Classification Search ............... 348/340, 348/335; 359/350, 359, 360; 427/162; 428/411.1, 428/426, 432, 433
See application file for complete search history.

(56) References Cited

U.S. PATENT DOCUMENTS

2011/0052180 A1*   3/2011   Pei et al. .................. 396/439
* cited by examiner

*Primary Examiner* — Sinh Tran
*Assistant Examiner* — Mark Monk
(74) *Attorney, Agent, or Firm* — Altis Law Group, Inc.

(57) ABSTRACT

An electromagnetic shielding coating covers a lens coated with an optical coating. A light shielding coating covers the optical coating. The electromagnetic shielding coating covers the light shielding coating. The electromagnetic shielding coating includes a first stainless steel layer and a second copper layer. The first stainless steel layer contains stainless steel, and is formed on the light shielding coating directly. The second copper layer is formed on the first metal layer.

5 Claims, 6 Drawing Sheets

ELECTROMAGNETIC SHIELDING COATING AND LENS MODULE UTILIZING THE SAME

BACKGROUND

1. Technical Field

The present disclosure relates to lens modules and, particularly, to an electromagnetic shielding coating and lens module utilizing the same.

2. Description of Related Art

Many camera modules are currently manufactured using wafer level assembly. One kind of such camera modules includes an image sensor, a lens, and a spacer. The spacer is adhered to the image sensor. The lens is stacked on the spacer. A light shielding coating covers the peripheral surface of the lens. An electromagnetic shielding coating covers the light shielding coating. The electromagnetic shielding coating includes a copper layer adhered to the light shielding coating, and a stainless steel layer adhered to the copper layer.

However, if the lens has been covered with an optical coating, and the light shielding coating is coated on the optical coating, generally significant stress exists among the light shielding coating, the copper layer of the electromagnetic shielding coating, and the optical coating. If the thickness of the electromagnetic shielding coating exceeds 1 µm, adherence between the light shielding coating and the optical coating becomes weak, and the light shielding coating and the electromagnetic shielding coating are easily peeled off from the optical coating.

What is needed, therefore, is an electromagnetic shielding coating and lens module utilizing the same to overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the electromagnetic shielding coating and lens module utilizing the same.

DETAILED DESCRIPTION

Embodiments of the present disclosure will now be described in detail, with reference to the accompanying drawings.

Figure 1:
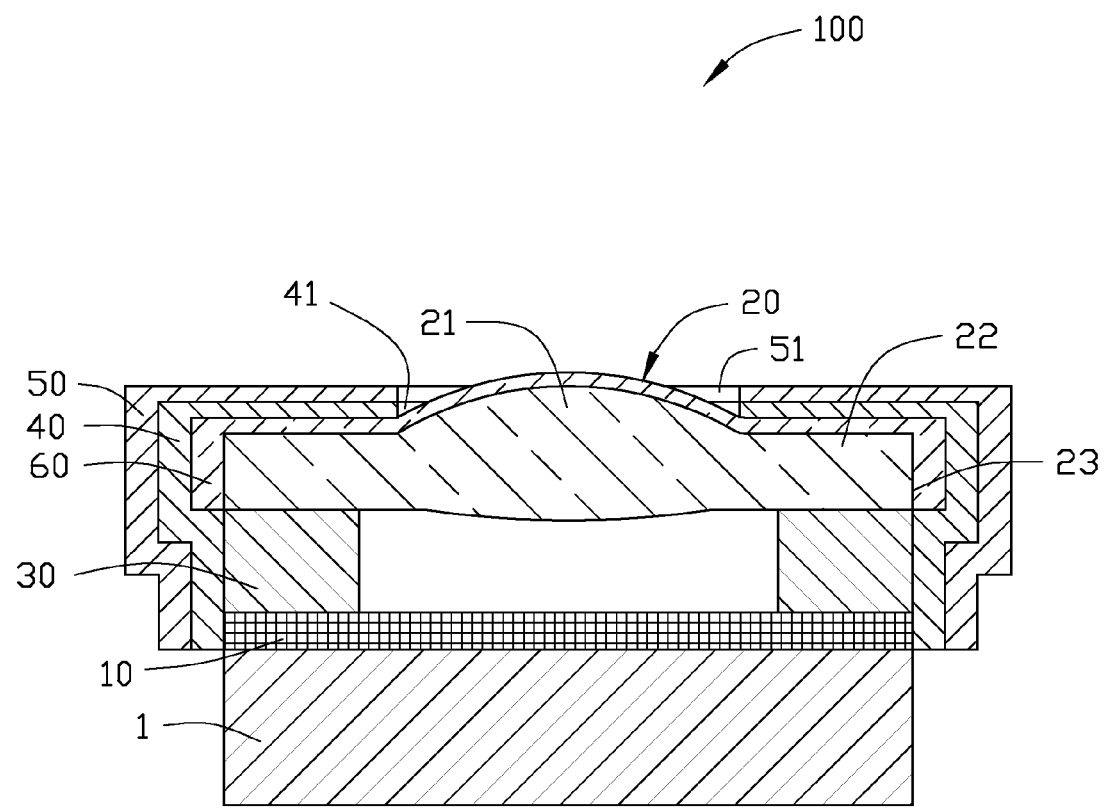
FIG. 1 is a cross-section of a lens module according to an exemplary embodiment.

Referring to FIG. 1, a lens module 100 includes a lens 20 covered by an electromagnetic shielding coating 50. The lens module 100 further includes a wafer 1, an image sensor 10, and a spacer 30. The lens module 100 is manufactured using wafer level assembly.

The image sensor 10 is formed on the wafer 1 using wafer level package. The image sensor 10 can be a Charged Coupled Device (CCD), a Complementary Metal-Oxide Semiconductor (CMOS), or the like. In the present disclosure, the image sensor 10 is a Charged Coupled Device. The spacer 30 is adhered to the image sensor 10. The lens 20 is stacked on the spacer 30. The lens 20 includes an optical portion 21 and a fixing portion 22 surrounding the optical portion 21. The fixing portion 22 defines a peripheral surface 23 at the circumference thereof. An optical coating 60 covers the lens 20. In the present disclosure, the optical coating 60 covers the optical portion 21, and the fixing portion 22 involving the peripheral surface 23. The optical coating 60 faces the object side of the lens module 100. The optical coating 60 can be an anti-reflection coating or an IR filtering coating. In the present disclosure, the optical coating 60 is an anti-reflection coating. A light shielding coating 40 covers the optical coating 60. In the present disclosure, the light shielding coating 40 covers the optical coating 60, the peripheral surface of the spacer 30 and the peripheral surface of the image sensor 10. The light shielding coating 40 defines a first aperture 41 at the center thereof. The first aperture 41 is substantially aligned with the optical portion 21. The light shielding coating 40 can be TiN (titanium nitride), CrN (chromium nitride) or TiCN (titanium carbonitride). In the present disclosure, the light shielding coating 40 is black CrN. An electromagnetic shielding coating 50 covers the light shielding coating 40. The electromagnetic shielding coating 50 defines a second aperture 51 at the center thereof. The second aperture 51 is substantially aligned with the first aperture 41.

Figure 2:
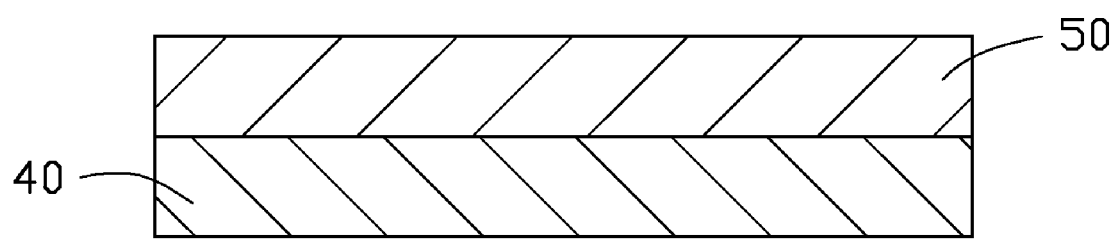
FIG. 2 is a cross-section of an electromagnetic shielding coating and a light shielding coating for a lens module such as, for example, that of FIG. 1 according to a first embodiment.

Referring to FIG. 2, the electromagnetic shielding coating 50 of a first exemplary embodiment is a mixture of stainless steel and copper. In the first embodiment, the electromagnetic shielding coating 50 is a mixture of $Cr_{18}Ni_9$ and copper. The electromagnetic shielding coating 50 is formed on the light shielding coating 40 by vacuum sputtering. In the mixture, increased copper proportion improves electromagnetic resistance, decreases adherence, and increases chance of electromagnetic shielding coating oxidation.

Figure 3:
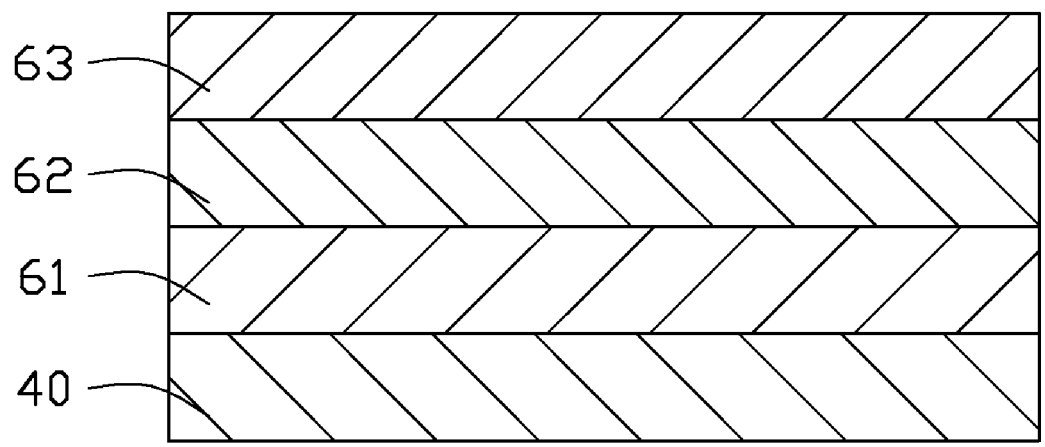
FIG. 3 is a cross-section of an electromagnetic shielding coating and a light shielding coating for a lens module such as, for example, that of FIG. 1 according to a second embodiment.

Referring to FIG. 3, the electromagnetic shielding coating 50 of a second exemplary embodiment includes a first metal layer 61 formed on the light shielding coating 40, a second metal layer 62 formed on the first metal layer 61, and a third metal layer 63 formed on the second metal layer 62. In the second embodiment, the first metal layer 61 only contains stainless steel. The first metal layer 61 is $Cr_{18}Ni_9$. The second metal layer 62 is copper. The second metal layer 62 is formed by vacuum sputtering. The third metal layer 63 is $Cr_{18}Ni_9$.

Figure 4:
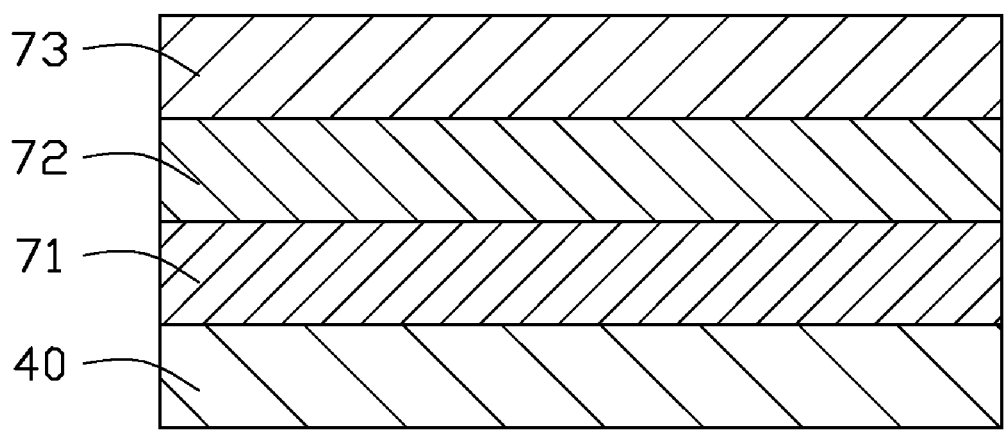
FIG. 4 is a cross-section of an electromagnetic shielding coating and a light shielding coating for a lens module such as, for example, that of FIG. 1 according to a third embodiment.

Referring to FIG. 4, the electromagnetic shielding coating 50 of a third exemplary embodiment includes a first metal layer 71, a second metal layer 72, and a third metal layer 73. The first metal layer 71 and the second metal layer 72 are similar to the first metal layer 61 and the second metal layer 62 of the second embodiment correspondingly. The third metal layer 63 is a mixture of $Cr_{18}Ni_9$ and copper. The third metal layer 73 is formed on the second metal layer 72. The electromagnetic shielding coating 50 has a higher electromagnetic resistance of the third embodiment than that of the second embodiment.

Figure 5:
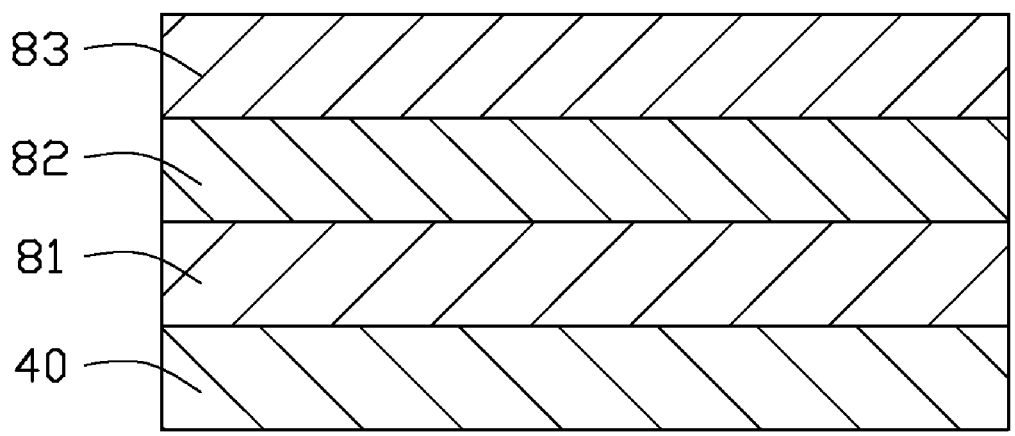
FIG. 5 is a cross-section of an electromagnetic shielding coating and a light shielding coating for a lens module such as, for example, that of FIG. 1 according to a fourth embodiment.

Referring to FIG. 5, the electromagnetic shielding coating 50 of a fourth exemplary embodiment includes a first metal layer 81, a second metal layer 82, and a third metal layer 83.

The second metal layer 82 and the third metal layer 83 are similar to the second metal layer 72 and the third metal layer 73 of the third embodiment. The first metal layer 81 is a mixture of $Cr_{18}Ni_9$ and copper. The electromagnetic shielding coating 50 has a higher electromagnetic resistance of the fourth embodiment than in the former embodiments. For the first metal layer 81 and the second metal layer 82 both contain copper, adherence between the first metal layer 81 and the second metal layer 82 is high. The electromagnetic shielding coating 50 of the fourth embodiment has the highest adherence strength among the four embodiments.

Figure 6:
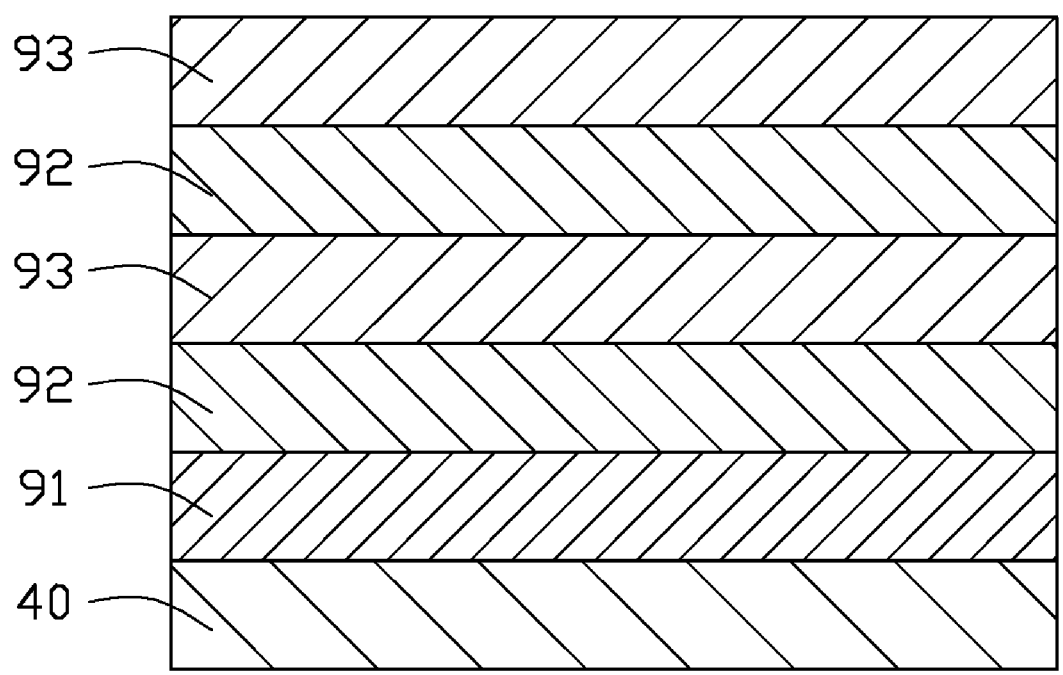
FIG. 6 is a cross-section of an electromagnetic shielding coating and a light shielding coating for a lens module such as, for example, that of FIG. 1 according to a fifth embodiment.

Referring to FIG. 6, the electromagnetic shielding coating 50 of a fifth exemplary embodiment includes a first metal layer 91, two second metal layers 92, and two third metal layers 93. Each thickness of the first metal and second metal layers 91 and 92 is less than 100 nm. In the present embodiment, the first metal layer 91 only contains stainless steel. The first metal layer 91 is $Cr_{18}Ni_9$, the second metal layer 92 is copper, and the third metal layer 93 is $Cr_{18}Ni_9$. The first metal layer 91 is formed on the light shielding coating 40. The second metal layers 92 and the third metal layers 93 are stacked alternately on the first metal layer 91. Decreased stress of the electromagnetic shielding coating 50 improves adherence for the thicknesses of the layers in nanometer-order.

The electromagnetic shielding coating 50 of the disclosure was tested utilizing ISO2409-2007 paints and varnishes-cross-cut test. Tape used was Scotch 610. During the test, if the thickness of each electromagnetic shielding coating 50 in the five embodiments exceed 2.5 µm, the light shielding coating 40 and the electromagnetic shielding coating 50 are peeled off from the optical coating 60. But the electromagnetic shielding coating in the prior art exceeds only 1 µm, the light shielding coating 40 and the electromagnetic shielding coating are peeled off from the optical coating 60. Adherences of the electromagnetic shielding coating 50 are enhanced.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. An electromagnetic shielding coating covering a lens coated with an anti-reflection/IR filtering coating and with a light shielding coating covering the optical coating, the electromagnetic shielding coating comprising:
   a first metal layer containing stainless steel covering the light shielding coating directly;
   a second copper layer formed on the first metal layer, and
   a third stainless steel layer formed on the second copper layer.

2. The electromagnetic shielding coating as claimed in claim 1, wherein the first metal layer only comprises stainless steel.

3. A lens module comprising:
   an image sensor;
   a spacer attached on the sensor;
   a lens stacked on the spacer, the lens comprising:
      an optical portion formed at the center thereof;
      a fixing portion surrounding the optical portion, and the fixing portion defining a peripheral surface at the periphery thereof;
      an optical coating covering the lens;
   a light shielding coating covering the optical coating, a peripheral surface of the spacer and a peripheral surface of the image sensor, and the light shielding coating defining a first aperture aligned with the optical portion;
   an electromagnetic shielding coating covering the light shielding coating, the electromagnetic shielding coating defining a second aperture aligned with the first aperture, and the electromagnetic shielding coating comprising:
      a first metal layer comprising stainless steel covering the light shielding coating directly; and
      a second copper layer formed on the first metal layer.

4. The lens module as claimed in claim 3, wherein a third stainless steel layer is formed on the second copper layer.

5. The lens module as claimed in claim 4, wherein the first metal layer only comprises stainless steel.

* * * * *